United States Patent
Doan et al.

(10) Patent No.: US 6,960,305 B2
(45) Date of Patent: Nov. 1, 2005

(54) METHODS FOR FORMING AND RELEASING MICROELECTROMECHANICAL STRUCTURES

(75) Inventors: Jonathan C. Doan, Mountain View, CA (US); Satyadev R. Patel, Elk Grove, CA (US); Andrew G. Huibers, Palo Alto, CA (US); Jason S. Reid, Los Gatos, CA (US)

(73) Assignee: Reflectivity, Inc, Sunnyvale, CA (US)

( * ) Notice: Subject to any disclaimer, the term of this patent is extended or adjusted under 35 U.S.C. 154(b) by 211 days.

(21) Appl. No.: 10/402,777

(22) Filed: Mar. 28, 2003

(65) Prior Publication Data

US 2004/0035821 A1 Feb. 26, 2004

Related U.S. Application Data

(63) Continuation-in-part of application No. 10/155,744, filed on May 24, 2002, now Pat. No. 6,741,383, which is a continuation-in-part of application No. 09/637,479, filed on Aug. 11, 2000, now Pat. No. 6,396,619, which is a continuation-in-part of application No. 10/005,308, filed on Dec. 3, 2001, which is a continuation-in-part of application No. 10/343,307, filed as application No. PCT/US01/24332 on Aug. 3, 2001, which is a continuation-in-part of application No. 10/176,478, filed on Jun. 21, 2002, which is a continuation-in-part of application No. 09/954,864, filed on Sep. 17, 2001, which is a continuation-in-part of application No. 09/427,841, filed on Oct. 26, 1999, now Pat. No. 6,290,864, which is a continuation-in-part of application No. 09/649,569, filed on Aug. 28, 2000, which is a continuation-in-part of application No. 10/346,506, filed on Jan. 15, 2003, which is a continuation-in-part of application No. 10/365,951, filed on Feb. 12, 2003.

(60) Provisional application No. 60/254,043, filed on Dec. 7, 2000, provisional application No. 60/229,246, filed on Aug. 30, 2000, provisional application No. 60/300,533, filed on Jun. 23, 2001, and provisional application No. 60/349,798, filed on Jan. 16, 2002.

(51) Int. Cl.$^7$ .............................................. B81C 1/00
(52) U.S. Cl. ............................... 216/2; 216/79; 438/48
(58) Field of Search ......................... 216/2, 79; 438/48

(56) References Cited

U.S. PATENT DOCUMENTS 3,511,727 A     5/1970   Hays (Continued)

FOREIGN PATENT DOCUMENTS

EP          0704884 A2     4/1996

(Continued)

OTHER PUBLICATIONS

Aliev et al., "Development of Si(100) Surface Roughness at the Initial Stage of Etching in F2 and XeF2 Gases Ellipsometric Study", Surface Science 442 (1999), pp. 206–214.

(Continued)

Primary Examiner—Allan Olsen
(74) Attorney, Agent, or Firm—Gregory R. Muir

(57) ABSTRACT

A method for making a spatial light modulator is disclosed, that comprises forming an array of micromirrors each having a hinge and a micromirror plate held via the hinge on a substrate, the micromirror plate being disposed in a plane separate from the hinge and having a hinge made of a transition metal nitride, followed by releasing the micromirrors in a spontaneous gas phase chemical etchant. Also disclosed is a projection system that comprises such a spatial light modulator, as well as a light source, condensing optics, wherein light from the light source is focused onto the array of micromirrors, projection optics for projecting light selectively reflected from the array of micromirrors onto a target, and a controller for selectively actuating the micromirrors in the array.

68 Claims, 11 Drawing Sheets

U.S. PATENT DOCUMENTS

| | | | |
|---|---|---|---|
| 4,190,488 A | | 2/1980 | Winters |
| 4,310,380 A | | 1/1982 | Flamm et al. |
| 4,498,953 A | | 2/1985 | Cook et al. |
| 5,439,553 A | | 8/1995 | Grant et al. |
| 5,504,614 A | * | 4/1996 | Webb et al. ................ 359/223 |
| 5,726,480 A | | 3/1998 | Pister |
| 5,835,256 A | | 11/1998 | Huibers |
| 5,998,816 A | | 12/1999 | Nakaki et al. |
| 6,005,706 A | | 12/1999 | Hwang |
| 6,051,503 A | | 4/2000 | Bhardwaj |
| 6,061,166 A | | 5/2000 | Furlani et al. |
| 6,115,172 A | | 9/2000 | Jeong |
| 6,162,367 A | | 12/2000 | Tai et al. |
| 6,172,796 B1 | | 1/2001 | Kowarz et al. |
| 6,197,610 B1 | | 3/2001 | Toda |
| 6,204,080 B1 | | 3/2001 | Hwang |
| 6,233,087 B1 | | 5/2001 | Hawkins et al. |
| 6,238,581 B1 | | 5/2001 | Hawkins et al. |
| 6,252,697 B1 | | 6/2001 | Hawkins et al. |
| 6,268,952 B1 | | 7/2001 | Godil et al. |
| 6,290,864 B1 | | 9/2001 | Patel et al. |
| 6,355,181 B1 | | 3/2002 | McQuarrie |
| 6,396,619 B1 | | 5/2002 | Huibers et al. |
| 6,409,876 B1 | | 6/2002 | McQuarrie et al. |
| 6,436,229 B2 | | 8/2002 | Tai et al. |
| 6,500,356 B2 | | 12/2002 | Goto et al. |
| 6,576,489 B2 | | 6/2003 | Leung et al. |
| 6,813,059 B2 | * | 11/2004 | Hunter et al. ................ 359/290 |
| 2001/0002663 A1 | | 6/2001 | Tai et al. |
| 2001/0024325 A1 | | 9/2001 | Kowarz et al. |
| 2002/0015215 A1 | * | 2/2002 | Miles ......................... 359/290 |
| 2002/0033229 A1 | | 3/2002 | Lebouitz et al. |
| 2002/0047172 A1 | | 4/2002 | Reid |
| 2002/0121502 A1 | | 9/2002 | Patel et al. |
| 2002/0126387 A1 | | 9/2002 | Ishikawa et al. |
| 2002/0163051 A1 | | 11/2002 | Gopal et al. |
| 2002/0164879 A1 | | 11/2002 | Leung et al. |
| 2002/0185699 A1 | | 12/2002 | Reid |
| 2002/0195418 A1 | | 12/2002 | Kowarz et al. |
| 2002/0196524 A1 | | 12/2002 | Huibers et al. |
| 2003/0054588 A1 | | 3/2003 | Patel et al. |
| 2003/0071015 A1 | | 4/2003 | Chinn et al. |
| 2003/0077878 A1 | | 4/2003 | Kumar et al. |
| 2003/0124848 A1 | | 7/2003 | Chinn et al. |
| 2003/0166342 A1 | | 9/2003 | Chinn et al. |
| 2003/0219986 A1 | | 11/2003 | Rattner et al. |
| 2004/0027701 A1 | * | 2/2004 | Ishikawa ..................... 359/883 |
| 2004/0156089 A1 | * | 8/2004 | Doan et al. .................. 359/291 |
| 2004/0191937 A1 | * | 9/2004 | Patel et al. ................... 438/21 |

FOREIGN PATENT DOCUMENTS

| | | |
|---|---|---|
| EP | 0822582 A2 | 2/1998 |
| EP | 0822584 A2 | 4/1998 |
| EP | 0878824 A2 | 11/1998 |
| EP | 0878824 A3 | 1/2000 |
| JP | 1982/57098679 A | 6/1982 |
| JP | 1983/58130529 A | 8/1983 |
| JP | 1985/60057938 A | 4/1985 |
| JP | 1986/61053732 A | 3/1986 |
| JP | 1986/61134019 A | 6/1986 |
| JP | 1986/61181131 A | 8/1986 |
| JP | 1986/61187238 A | 8/1986 |
| JP | 1986/61270830 A | 12/1986 |
| JP | 1987/62071217 A | 4/1987 |
| JP | 1988/63155713 A | 6/1988 |
| JP | 1989/01208834 A | 8/1989 |
| JP | 1989/10217921 A | 8/1989 |
| JP | 1990/02250323 A | 10/1990 |
| JP | 1991/03012921 A | 1/1991 |
| JP | 1992/04096222 A | 3/1992 |
| JP | 1995/07029823 A | 1/1995 |
| JP | 1997/09251981 A | 9/1997 |
| JP | 1998/10313128 A | 11/1998 |
| JP | 1998/10317169 A | 12/1998 |
| WO | WO-98/32163 | 7/1998 |
| WO | WO-99/49506 | 9/1999 |

OTHER PUBLICATIONS

Glidemeister, J.M., "Xenon Difluoride Etching System" (Nov. 17, 1997).

Habuka et al., "Dominant Overall Chemical Reaction in a Chlorine Trifluoride–Silicon–Nitrogen System at Atmospheric Pressure", Japan Journal of Applied Physics vol. 38 (1999), pp. 6466–6469.

Hecht et al., "A Novel X–ray Photoelectron Spectroscopy Study of the Al/SiO2 Interface", J. Appl. Phys. vol. 57 (Jun. 15, 1985), pp. 5256–5261.

Houle, F.A., "Dynamics of SiF4 Desorption During Etching of Silicon by XeF2", IBM Almaden Research Center (Apr. 15, 1987), pp. 1866–1872.

Flamm et al., "XeF2 and F–Atom Reactions with Si: Their Significance for Plasma Etching", Solid–State Technol. 26, 117 (1983).

Ibbotson et al., "Plasmaless Dry Etching of Silicon with Fluorine–containing Compounds", J. Appl. Phys. vol. 56 No. 10 (Nov. 1984), pp. 2939–2942.

Ibbotson et al., "Comparison of XeF2 and F–atom Reactions with Si and SiO2", Applied Physics Letter, vol. 44, 1129 (1984).

Streller et al., "Selectivity in Dry Etching of Si (100) and XeF2 and VUV Light", Elsevier Science B.V., Applied Surface Science vol. 106 (1996), pp. 341–346.

Vugts et al., "Si/XeF2 Etching: Temperature Dependence", J. Vac. Sci. Technol. A 14(5) (Sep./Oct. 1995), pp. 2766–2774.

Winters, H.F., "Etch Products from the Reaction of XeF2 with SiO2, SiO3, Si3N4, SiC, and Si in the Presence of Ion Bombardment", J. Vac. Sci. Technol. B 1(4) (Oct./Dec. 1983), pp. 927–931.

Kurt Williams, Etch Rates for Micromachining Processing–Part II, 2003 IEEE, pp. 761–778, Journal of Microelctromechanical Systems, vol. 12, No. 6, Dec. 2003.

Winters et al., "The Etching of Silicon with XeF2 Vapor", Appl. Phys. Letter, vol. 34(1) (Jan. 1, 1979), pp. 70–73.

XACTIX, Inc., Marketing Brochure (Jun. 27, 1999).

"Xenon Difluoride Isotropic Etch System: Seeing is Believing", Surface Technology Ltd. brochure, Newport, UK (date unknown).

Chu et al., "Controlled Pulse–Etching with Xenon Difluoride", International Solid State Sensors and Actuators Conference (Transducers '97), Chicago, IL, vol. 1 (Jun. 16–19, 1997), pp. 665–668 (abstract only).

Bassom et al., "Modeling and Optimizing XeF2–enhanced FIB Milling of Silicon", 25th International Symposium for Testing and Failure Analysis, Santa Clara, CA (Nov. 14–18, 1999), pp. 255–261 (abstract only).

Kohler et al., "Fabrication of Microlenses by Plasmaless Isotropic Etching Combined with Plastic Moulding", Sens, Actuators A, Phys. (Switzerland), vol. A53, No. 1–3 (May 1996), pp. 361–363 (abstract only).

Chan et al., "Gas Phase Pulse Etching of Silicon for MEMS with Xenon Difluoride", Engineering Solutions for the Next Millenium: 1999 IEEE Canadian Conference on Electrical and Computer Engineering, Edmonton, Alberta, vol. 3 (May 9–12, 1999), pp. 1637–1642 (abstract only).

Chang et al., "Gas–Phase Silicon Micromachining with Silicon Difluoride", Proceedings of the SPIE—The International Socity for Optical Engineering, vol. 2641 (1995), pp. 117–128 (abstract only).

Sebel et al., "Reaction Layer Dynamics in Ion–Assisted Si/XeF2 Etching: Temperature Dependence", J. Vac. Sci. Technol. A, Vac. Surf. Films, vol. 18, No. 6, (Nov. 2000), pp. 2759–2769 (abstract only).

Sebel et al., "Silicon Etch Rate Enhancement by Traces of Metal", J. Vac. Sci. Technol. A, Vac. Surf. Films, vol. 17, No. 3, (May/Jun. 1999), pp. 755–762 (abstract only).

Sugano et al., "Study on XeF2 Pulse Etching Using Wagon Wheel Pattern", Proceedings of the 1999 International Symposium on Micromechantronics and Human Science: Towards the New Century, Nagoya, Japan (Nov. 23–26, 1999), pp. 163–167 (abstract only).

Wang et al., "Gas–Phase Silicon Etching with Bromine Trifluoride", International Solid State Sensors and Actuators Conference (Transducers '97), Chicago, IL, vol. 2 (Jun. 16–19, 1997), pp. 1505–1508 (abstract only).

Muthukumaran et al., "Gas–Phase Xenon Difluoride Etching of Microsystems Fabricated Through the Mitel 1.5–mu m CMOS Process", Can. J. Electr. Comput. Eng. (Canada), vol. 25, No. 1 (Jan. 2000), pp. 35–41 (abstract only).

Toda et al., "Thin Beam Bulk Micromachining Based on RIE and Xenon Difluoride Silicon Etching", International Solid State Sensors and Actuators Conference (Transducers '97), Chicago, IL, vol. 1 (Jun. 16–19, 1997), pp. 671–674.

Sebel et al., "Etching of Si Through a Thick Condensed XeF2 Layer", J. Vac. Sci. Technol. A, Vac. Surf, Films, vol. 18, No. 5 (Sep./Oct. 2000), pp. 2090–2097 (abstract only).

* cited by examiner

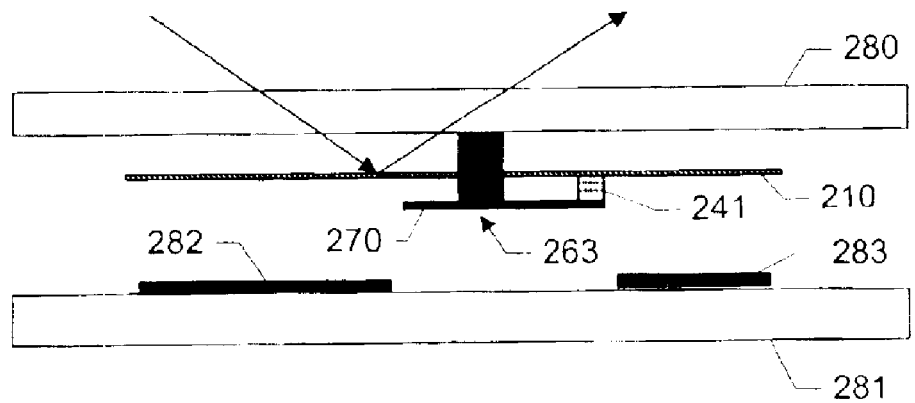
FIG. 4A
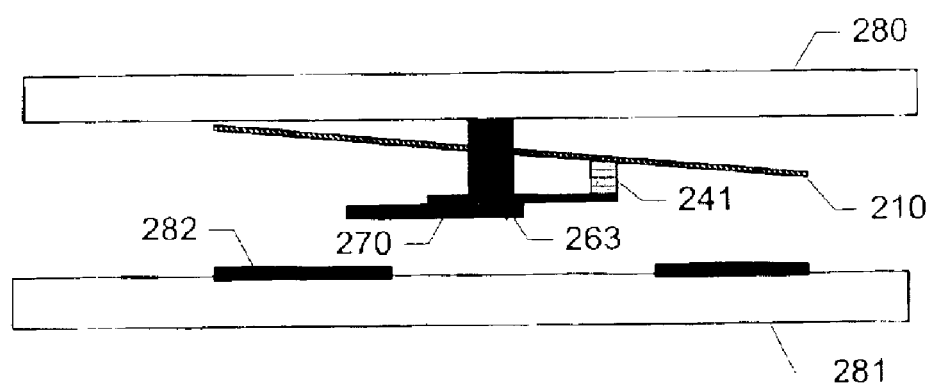
FIG. 4B  "Off"-state

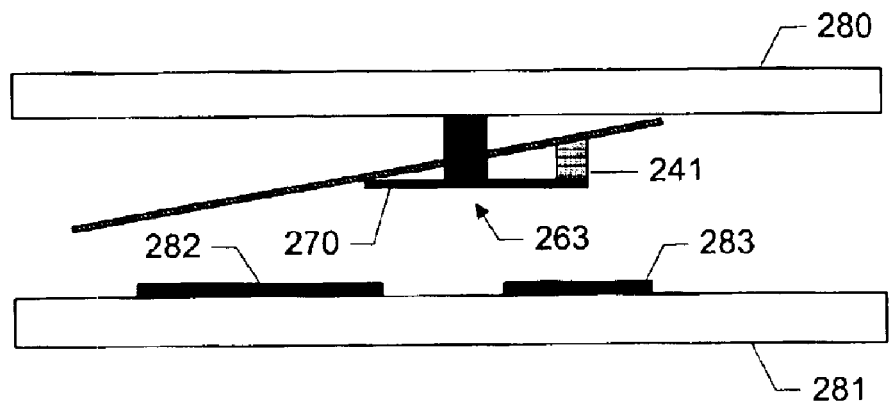
FIG. 4C  "ON"-state
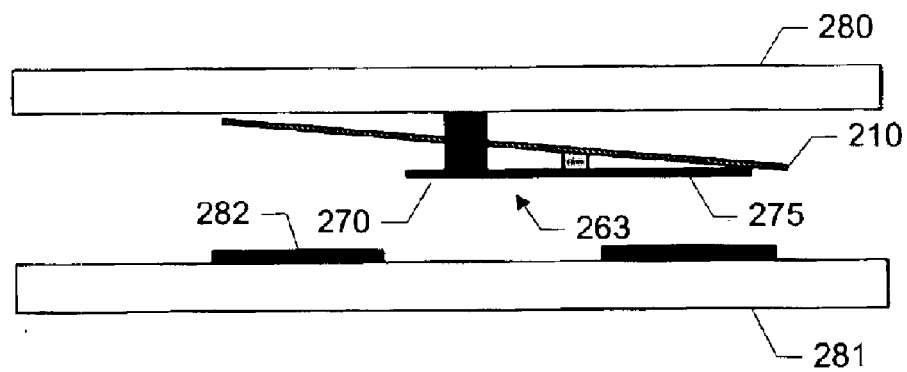
FIG. 4D  "Off"-state
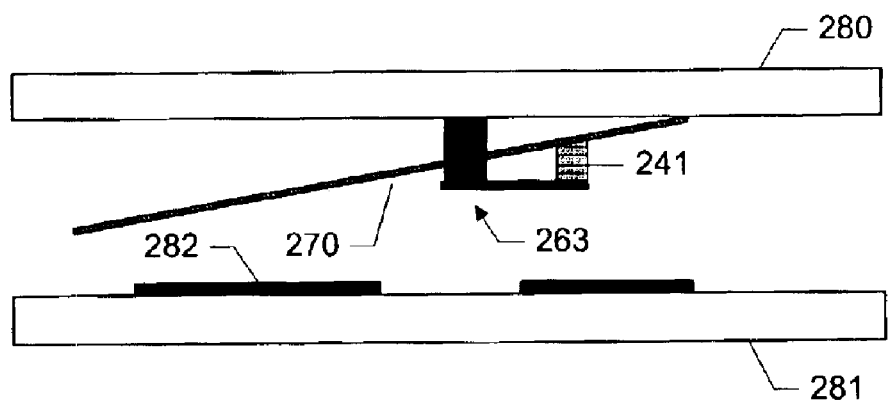
FIG. 4E  "ON"-state

METHODS FOR FORMING AND RELEASING MICROELECTROMECHANICAL STRUCTURES

This application is a continuation-in-part of a) U.S. patent application Ser. No. 10/155,744 to Huibers et al, filed May 24, 2002, now U.S. Pat. No. 6,741,383 which is a continuation-in-part of U.S. patent application Ser. No. 09/637,479 to Huibers et al, filed Aug. 11, 2000 now U.S. Pat. No. 6,396,619; b) U.S. patent application Ser. No. 10/005,308 to Patel et al, filed Dec. 3, 2001, which claims priority to U.S. provisional application 60/254,043 to Patel et al., filed Dec. 7, 2000; c) U.S. patent application Ser. No. 10/343,307 to Huibers filed Jan. 29, 2003, which is a U.S. national phase application of PCT/US01/24332 filed Aug. 3, 2001, which claims priority to U.S. provisional application 60/229,246 to Ilkov et al. filed Aug. 30, 2000; d) U.S. patent application Ser. No. 10/176,478 to Reid, filed Jun. 21, 2002, which claims priority to U.S. provisional application 60/300,533, filed Jun. 23, 2001; e) U.S. patent application Ser. No. 09/954,864 to Patel et al, filed Sep. 17, 2001, which is a continuation-in-part of U.S. patent application Ser. No. 09/427,841 filed Oct. 26, 1999 (now U.S. Pat. No. 6,290,864) and U.S. patent application Ser. No. 09/649,569 filed Aug. 28, 2000; f) U.S. patent application Ser. No. 10/346,506 to Huibers et al, filed Jan. 15, 2003, which claims priority to U.S. provisional application 60/349,798, filed Jan. 16, 2002; and g) U.S. patent application Ser. No. 10/365,951 to Doan et al, filed Feb. 12, 2003. Each of the above applications are incorporated herein by reference in their entirety.

TECHNICAL FIELD OF THE INVENTION

The present invention is related generally to spatial light modulators, and, more particularly, to fabrications of spatial light modulators with hinge structures made of particular materials that withstand spontaneous gas phase chemical etchants.

BACKGROUND OF THE INVENTION

Spatial light modulators (SLMs) are transducers that modulate an incident beam of light in a spatial pattern in response to an optical or electrical input. The incident light beam may be modulated in phase, intensity, polarization, or direction. This modulation may be accomplished through the use of a variety of materials exhibiting magneto-optic, electro-optic, or elastic properties. SLMs have many applications, including optical information processing, display systems, and electrostatic printing.

Spatial light modulators in projection displays that have micromirror arrays generally have plate portions for reflecting light and hinge portions for allowing movement of the plate portions, such as in response to an electrostatic attraction from an adjacent electrode. The plate portions can be rotated between ON and OFF positions, where light is directed through projection optics from ON micromirrors onto a target. The micromirrors can be operated in analog mode or in digital pulse width modulation mode in order to obtain gray scale at each micromirror location. A color sequencing device, such as a prism or color wheel, can be used to create a color image—or dedicated spatial light modulators for individual colors can be used.

SUMMARY OF THE INVENTION

In one embodiment of the invention, a method for making a MEMS device, comprises: depositing a sacrificial material on a substrate; forming an array of MEMS elements comprised of plates and hinges, wherein the hinges of the MEMS elements comprise an early transition metal (groups 3b–7b of the periodic table) nitride; and releasing the MEMS elements by removing the sacrificial material in a spontaneous gas phase chemical etchant selected from interhalogens and noble gas halides, wherein the early transition metal nitride is exposed to the etchant during removal of the sacrificial material but remains after the MEMS elements are released.

In another embodiment of the invention, a method for making a micromirror array for a projection display, comprises depositing a sacrificial material on a substrate; forming an array of micromirrors comprised of mirror plates and hinges, wherein the hinges of the micromirrors comprise an early transition metal (groups 3–7 of the periodic table) nitride; and releasing the micromirrors by removing the sacrificial material in a spontaneous gas phase chemical etchant selected from interhalogens and noble gas halides, wherein the early transition metal nitride is exposed to the etchant during removal of the sacrificial material but remains after the micromirrors are released.

BRIEF DESCRIPTION OF DRAWINGS

While the appended claims set forth the features of the present invention with particularity, the invention, together with its objects and advantages, may be best understood from the following detailed description taken in conjunction with the accompanying drawings of which:

FIG. 4A is a cross-sectional view of the micromirror device in an "OFF" state;

FIG. 4B is a cross-sectional view of the micromirror device in another "OFF" state;

FIG. 4C is a cross-sectional view of the micromirror device in an "ON" state;

FIG. 4D is a cross-sectional view of the micromirror device in yet another "OFF" state, wherein the hinge-structure has two sets of mirror stops;

FIG. 4E is a cross-sectional view of another embodiment of the micromirror device with the mirror in the "ON" state;

DETAILED DESCRIPTION OF THE EMBODIMENTS

Methods

Processes for micro-fabricating a MEMS device such as a movable micromirror and mirror array are disclosed in U.S. Pat. Nos. 5,835,256 and 6,046,840 both to Huibers, the subject matter of each being incorporated herein by reference. A similar process for forming MEMS movable elements (e.g. mirrors) on a wafer substrate (e.g. a light transmissive substrate or a substrate comprising CMOS or other circuitry) is illustrated in the present application. By "light transmissive", it is meant that the material will be transmissive to light at least in operation of the device (The material could temporarily have a light blocking layer on it to improve the ability to handle the substrate during manufacture, or a partial light blocking layer for decreasing light scatter during use. Regardless, a portion of the substrate, for visible light applications, is preferably transmissive to visible light during use so that light can pass into the device, be reflected by the mirrors, and pass back out of the device. Of course, not all embodiments will use a light transmissive substrate). By "wafer" it is meant any substrate on which multiple micromirrors or microstructure arrays are to be formed and which allows for being divided into dies, each die having one or more micromirrors thereon. Though not in every situation, often each die is one device or product to be packaged and sold separately. Forming multiple "products" or dies on a larger substrate or wafer allows for lower and faster manufacturing costs as compared to forming each die separately. Of course the wafers can be any size or shape, though it is preferred that the wafers be the conventional round or substantially round wafers (e.g. 4", 6" or 12" in diameter) so as to allow for manufacture in a standard foundry.

The present invention provides a spatial light modulator that has a higher resolution, an increased fill factor, and an increased contrast ratio in displaying an image. The spatial light modulator may be operated in the absence of polarized light. Moreover, the spatial light modulator has improved electro-mechanical performance and robustness with respect to manufacturing.

Figure 1:
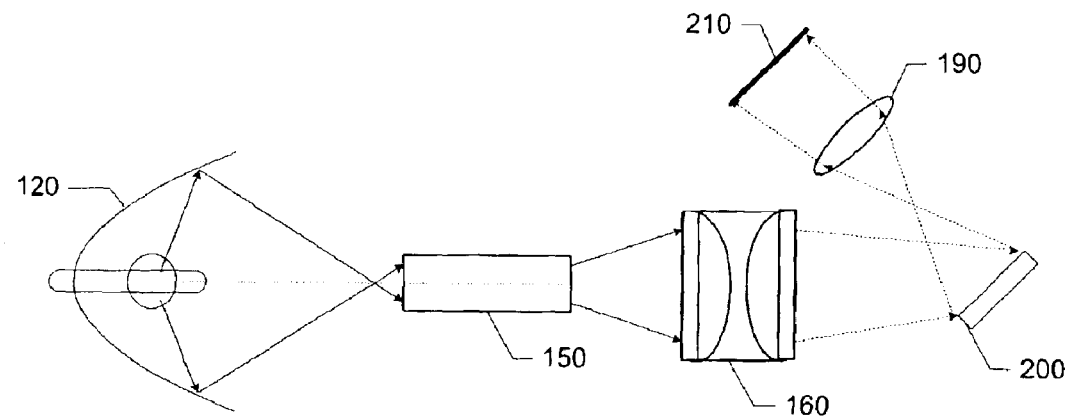
FIG. 1 diagrammatically illustrates an exemplary display system employing a spatial light modulator.

The spatial light modulator of the present invention has a variety of applications (e.g. maskless lithography, atomic spectroscopy, maskless fabrication of micromirror arrays, signal processing, microscopy etc), one of which is in display systems. A typical display system employing a spatial light modulator is illustrated in FIG. 1. In its very basic configuration, the display system comprises light source 120, optical devices (e.g. light pipe 150, collection optics 160 and projection optics 190), display target 210 and spatial light modulator 200. Light source 120 (e.g. an arc lamp) directs light through the light integrator/pipe 150 and collection optics 160 and onto spatial light modulator 200. The micromirrors of the spatial light modulator 200 are selectively actuated by a controller (e.g. as disclosed in U.S. Pat. No. 6,388,661 issued May 14, 2002 incorporated herein by reference) so as to reflect—when in their "ON" position—the incident light into projection optics 190, resulting in an image on display target 210 (screen, a viewer's eyes, a photosensitive material, etc.). Of course, more complex optical systems are often used—the display system of FIG. 1 being a simplification of a typical projection display optical system.

Figure 2:
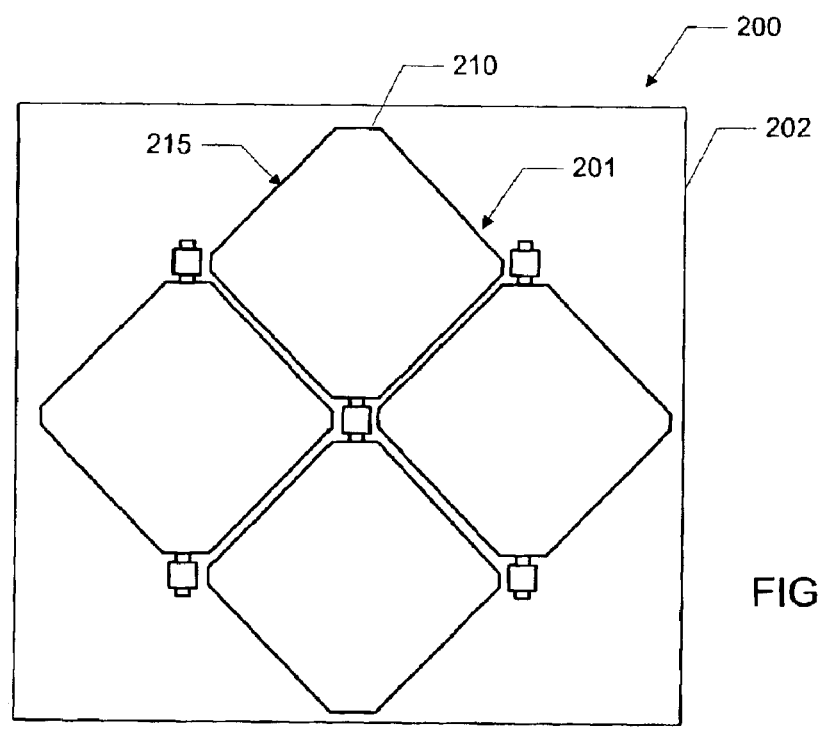
FIG. 2 is a top-view of the spatial light modulator used in the display system of FIG. 1.

The spatial light modulator, in general, comprises an array of thousands or millions of micromirrors. FIG. 2 illustrates a portion of an exemplary micromirror array. Referring to FIG. 2, a top-view of a portion of an exemplary spatial light modulator 200 looking through glass is illustrated therein. As shown, the spatial light modulator comprises micromirror array 201 that is formed on a substrate 202, such as glass that is visible light transmissive. Alternatively, substrate 202 is a typical semiconductor wafer that has formed thereon an array of electrodes and circuitry (not shown in FIG. 2) for electrostatically controlling motions of the micromirrors. Micromirror array 201 comprises a plurality of micromirror devices, such as micromirror device 215. And each micromirror device further comprises a reflective micromirror plate, such as micromirror plate 210 for reflecting the incident light. In operation, each individual micromirror can be deflected as desired under the control of one or more electrodes and circuitry, thereby the spatial modulation of the incident light traveling through substrate 202 (in this case, the substrate is a glass) and incident on the surfaces of the micromirrors can be achieved. To facilitate the micromirror plate rotating above the substrate (or below, depending upon the point of view) for reflecting the incident light, a hinge-structure is necessary to hold the micromirror plate above the substrate and provide a means for rotation of the micromirror plate.

Figure 3A:
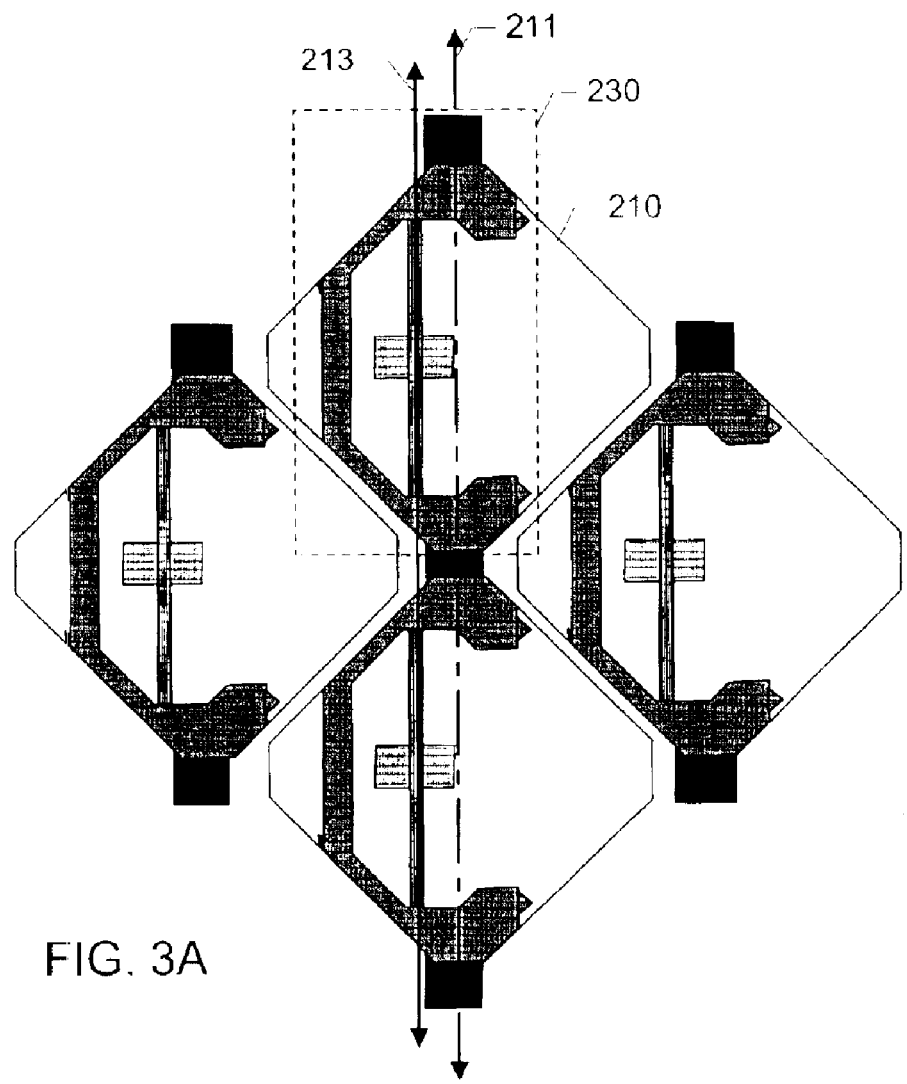
FIG. 3A is a back-view of a set of micromirrors according to an embodiment of the invention.

Referring to FIG. 3A, a back-view of the micromirror array (e.g. 201) shown in FIG. 2 is illustrated therein. Each micromirror plate (e.g. micromirror 210) is attached to a hinge-structure (e.g. hinge structure 230) such that the micromirror plate can pivot along the hinge structure above the substrate (e.g. substrate 202 in FIG. 2). In order to improve the quality of displayed images, the hinge structure is preferably formed under the micromirror plates as shown. Specifically, the hinge structure and the surface for reflecting the incident light are on the opposite sides of the micromirror plate.

According to an embodiment of the invention, the micromirror plate is attached to the hinge structure such that the micromirror plate can pivot along an axis that is parallel to but offset from a diagonal of the micromirror plate (when viewed as both a cross section and as a top view). For example, micromirror plate 210 has a well defined geometrical diagonal 211. However, the rotation axis of the micromirror plate is along direction 213 that is parallel to but offset from diagonal 211. Such a rotation axis can be achieved by attaching the hinge structure to the mirror plate at a point not along the mirror plate diagonal 211. The point of attachment can be at least 0.5 um, at least 1 um, or at least 2 um away from the diagonal 211. In one embodiment, the point of attachment is from 1/40 to 1/3 the length of the diagonal away from diagonal 211, or from 1/20 to 1/4 if desired—although any desired distance away from the diagonal is possible if so desired in the present invention. In the present invention, the micromirror preferably has a substantially four-sided shape. Whether the micromirror is a rectangle, square, rhombus or trapezoid, even if the corners are rounded or "clipped" or if an aperture or protrusion is located on one or more of the sides of the micromirror, it is still possible to conceptually connect the four major sides of the micromirror shape and take a diagonal across the middle of the micromirror. In this way, a center diagonal can be defined even if the micromirror plate is substantially but not perfectly a rhombus, trapezoid, rectangle, square, etc. However, the rotation axis of the micromirror plate is not along the center diagonal but is along direction 213 that is parallel to but offset from diagonal 211 in FIG. 3A. By "parallel to but offset from the diagonal", it is meant that the axis of rotation can be exactly parallel to or substantially parallel to (±19 degrees) the diagonal of the micromirror. This type of design benefits the performance of the micromirror device in a number of ways. One advantage of this asymmetric offset arrangement is that the micromirror plate can rotate at a larger angle than the rotation angle that can be achieved in a symmetrical arrangement (with a mirror plate—substrate gap being the same). The length of the diagonal of the mirror plate is preferably 25 microns or less.

Figure 3B:
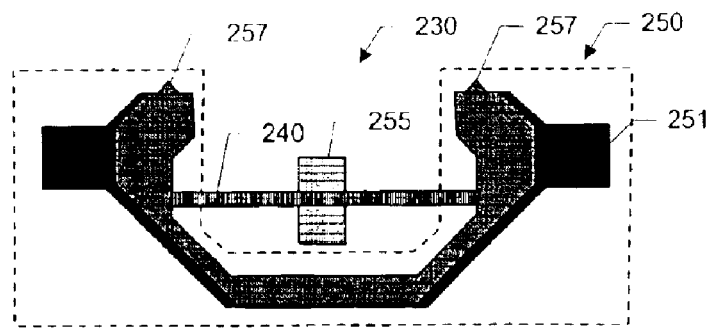
FIG. 3B illustrates a hinge-structure of the micromirrors of FIG. 3A.

In order to hold the micromirror plate and meanwhile, provide a mechanism for rotation of the micromirror plate above the substrate, each hinge structure, such as hinge structure 230, further comprises hinge-support 250 and hinge 240, as shown in FIG. 3B. Hinge 240 is attached to the micromirror plate via contact 257. Hinge support 250 further comprises two posts 251. By "hinge" is meant the layer or stack of layers that defines that portion of the device that flexes to allow movement of the device (described in detail below). To improve the performance of the micromirror plate, further fine structures are also provided thereon. Specifically, two mirror stops 255 are formed on an edge of hinge support 250 for stopping the rotation of the micromirror plate when the micromirror plate achieves a certain angle. The geometrical arrangement, such as the length and the position of the mirror stop from the hinge-plate, along with the distance between the micromirror plate and the hinge determines the maximum rotation angle that the micromirror can achieve before contact. By properly setting the mirror stops for all micromirror plates in the micromirror array, a maximum rotation angle for all micromirrors can be uniformly defined. This uniformly defined rotation angle can then be defined as an "ON" state for all micromirrors in operation. In this case, all micromirrors in the spatial light modulator rotate to the uniformly defined angle in the "ON" state in an operation. The incident light can thus be uniformly reflected towards one desired direction for display. Obviously, this significantly improves the quality of the displayed image. Though preferred, the number of the mirror stops can be of any desired number (one or more) or need not be provided at all. And each mirror stop can be of any desired shape, though preferably one that minimizes the amount of contact between the mirror stop and the micromirror plate.

In the embodiment of the invention, the two posts are formed on the substrate. Hinge-support 250 is supported by the two posts above the substrate. The hinge (e.g. hinge 240) is affixed to the hinge-support and attached to the micromirror plate via the contact (e.g. contact 255). In this configuration, the micromirror plate can pivot along the hinge above the substrate.

Figure 3C:
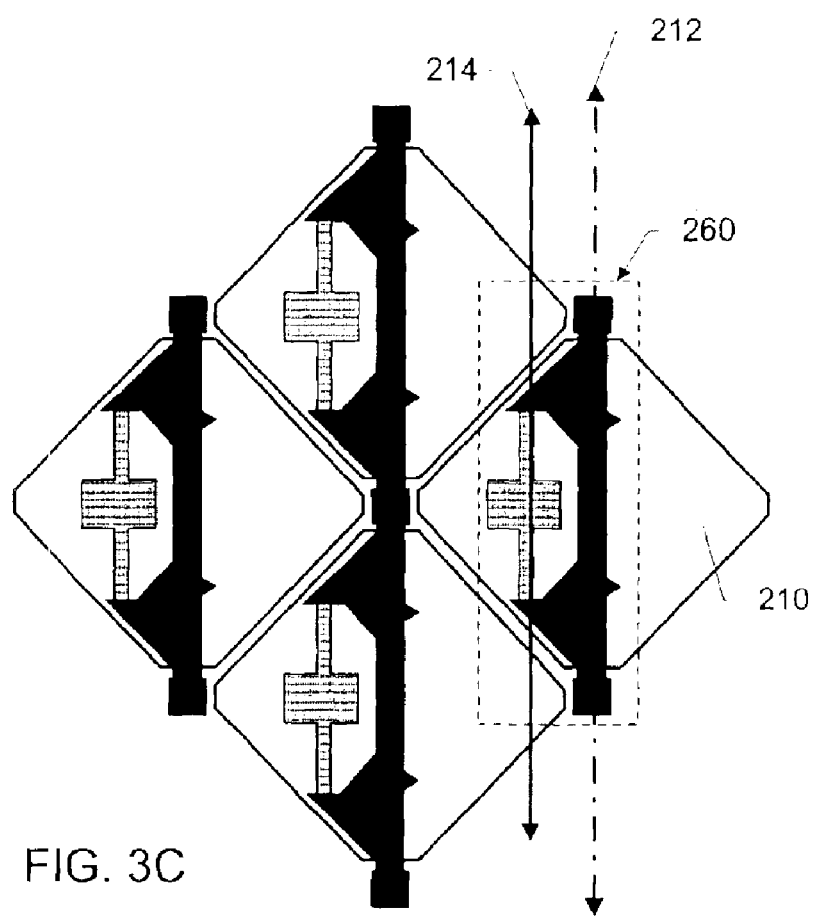
FIG. 3C is a back-view of a set of micromirrors according to another embodiment of the invention.

The hinge structure can take other suitable forms as desired. FIG. 3C illustrates another hinge structure design according to another embodiment of the invention. Similar to that of FIG. 3A, hinge structure 260 is formed on the substrate for supporting micromirror plate 210 and provides a rotation axis 214 for the micromirror plate. Rotation axis 214 is parallel to, but offset from a diagonal of micromirror plate 212. Similar to hinge-support 250 in FIG. 3B, hinge-support 263 in FIG. 3D also has a plurality of mirror stops formed thereon for stopping the rotation of the micromirror plate when the micromirror plate achieves a certain angle. The geometrical arrangement, such as the length and the position on the hinge-support, along with the distance between the micromirror plate and the hinge determines the maximum rotation angle that the micromirror can achieve before contact. Though preferred, the number of the mirror stops can be of any desired number. And each mirror stop can be of any desired shape.

Figure 3D:
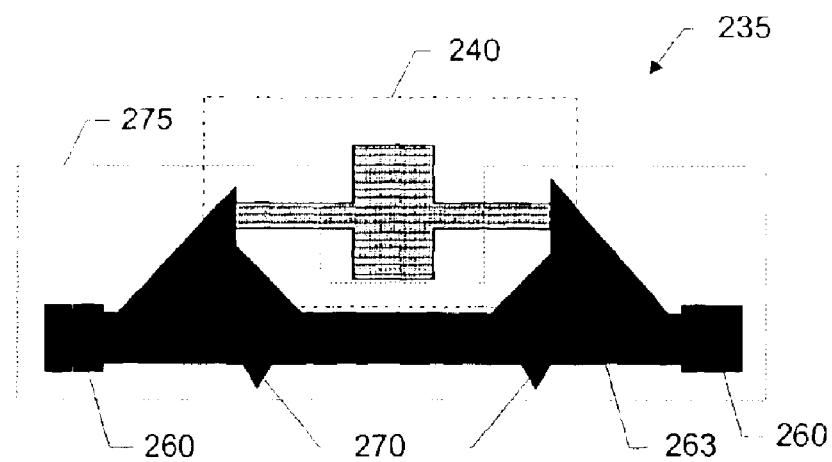
FIG. 3D shows a hinge-structure of the micromirrors of FIG. 3C.
Figure 3E:
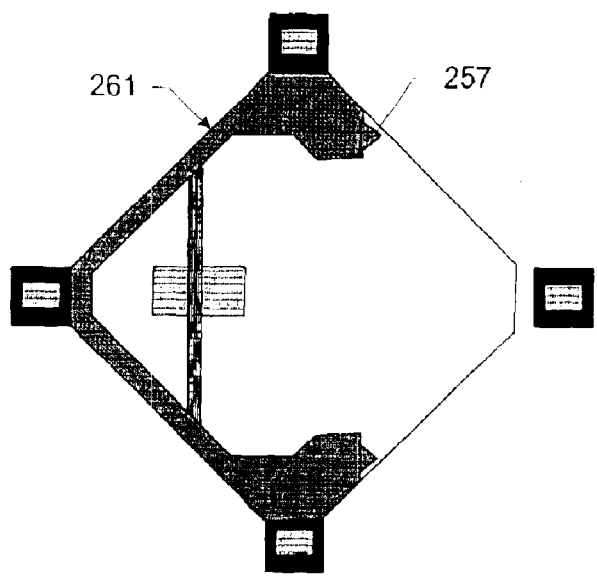
FIG. 3E illustrates therein a hinge-structure according to yet another embodiment of the invention.

The hinge structure can also take other suitable forms. For example, hinge support 261 can be formed along the edges of one part of the micromirror plate such that the hinge-support passes through a post of adjacent micromirror device, as shown in FIG. 3E In this case, the hinge-support of all micromirror devices form a continuous hinge-support frame for all micromirror plates. This allows 2-dimensional electrical connection of the micromirrors in the array.

Figure 3F:
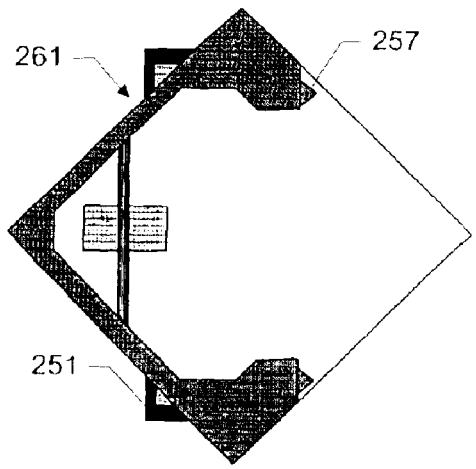
FIG. 3F illustrates therein a hinge-structure according to yet another embodiment of the invention.
Figure 3G:
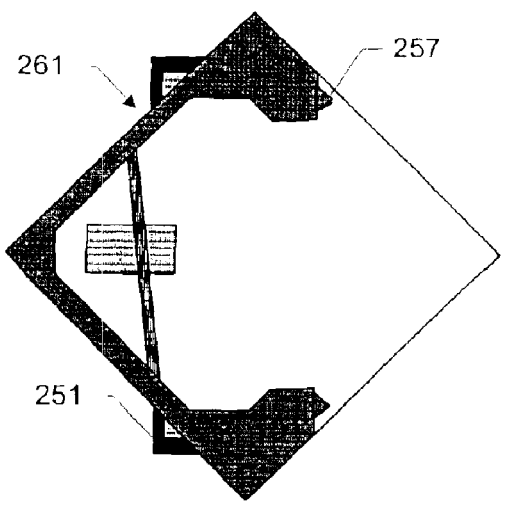
FIG. 3G illustrates therein a hinge-structure according to another embodiment of the invention.

Alternatively, the posts of each hinge structure are not required to be formed along the diagonal of the micromirror plate. Referring to FIG. 3F, two posts 251 of the hinge structure are formed along the edges of the micromirror plate instead of at the corners of the micromirror plate. In addition, the hinge is not required to be placed such that the hinge and the two arms intersected with the hinge form an isosceles triangle, as shown in the figure. Instead, as shown in FIG. 3G, the hinge may be placed such that it is substantially parallel but forms a small angle (±19 degrees) with the hinge position in FIG. 3F.

In operation, the micromirror plate rotates along the hinge that is parallel to but offset from a diagonal of the micromirror plate. Based on rotation angles, "ON" and "OFF" states are defined. At the "ON" state, the micromirror plate is rotated to a predefined angle such that the incident light can be reflected into a direction for view, for example, into a set of pre-arranged optic devices for directing light towards a target. In the "OFF" state, the micromirror plate stays flat or at another angle such that the incident light will be reflected away from the display target. FIG. 4A through FIG. 4D illustrate cross-sectional views of a micromirror device in operation.

Referring to FIG. 4A, an "OFF" state is define as micromirror plate 210 at its natural resting state that is parallel to glass substrate 280. Hinge support 263 is formed on the substrate for supporting the micromirror plate. The hinge (e.g. hinge 240 in FIG. 3B) is affixed to hinge-support 263 and attached to micromirror plate 210 via shallow via contact 241 (hereafter "contact") for providing a rotational axis for the micromirror plate. In this "OFF" state, the incident light travels through the glass substrate, shines on one surface of the micromirror plate at a particular incident angle and is reflected away from the target by the micromirror plate. The rotation of the micromirror plate can be electrostatically controlled by electrode 282 and a circuitry (not shown) that is connected to the electrode. In an embodiment of the invention, the electrode and circuitry are formed in wafer 281, which can be a typical silicon wafer. In order to efficiently control the rotation of the micromirror plate, wafer 281 is placed proximate to the micromirror plate such that electrostatic fields can be established between micromirrors and associated electrodes. Alternatively, more than one electrode can be used for controlling the rotation of the micromirror plate. Specifically, electrode 283 (and circuitry connected to the electrode, which is not shown) can be formed and placed underneath the other portion of the micromirror plate for controlling the micromirror plate in an "OFF" state, as shown in FIG. 4B. In another embodiment of the invention, the electrodes, the circuitry and the micromirrors can be formed on the same substrate, such as substrate 280. In this case, substrate 280 can be a standard silicon wafer. And the incident light shines the opposite surface of the micromirror plate. To improve the quality of the displayed image, especially the contrast ratio, it is desired that the reflected light in the "OFF" state be reflected as much as possible away from the collection optics or target. To achieve this, another "OFF" state is defined as shown in FIG. 4B. Referring to FIG. 4B, micromirror plate 210 is rotated at an angle in the "OFF" state. As an optional feature, the angle corresponding to this "OFF" state is defined such that one end of the micromirror plate touches and is stopped by the substrate when the micromirror plate is rotated to this angle. This definition ensures a uniform "OFF" state for all micromirror plates in the micromirror array. Of course, other methods can also be employed in defining an "OFF" state angle. For example, by properly controlling the electric field applied between the micromirror plate and the electrode(s) and circuitry associated with the micromirror plate, desired angles "corresponding to the "OFF" state can be achieved. In order to direct the reflected light into the target for displaying, the micromirror plate needs to be rotated to a certain angle, which is corresponds to an "ON" state. FIG. 4C illustrates a cross-sectional view of the micromirror device in an exemplary "ON" state according to an embodiment of the invention. In this "ON" state, the rotation of the micromirror plate is stopped by mirror stops 270. By adjusting the configuration (e.g. length and the position on the hinge structure) of the mirror stops, the angle corresponding to the "ON" state can thus be adjusted, as long as the other end of the micromirror plate is free to move. The presence of the mirror stops benefit a uniform "ON" state for all micromirror plates in the spatial light modulator, thus, the quality of the displayed image is significantly improved. As an optional feature of the embodiment, the mirror stops can be designed and formed such that the other end of the micromirror plate touches and is stopped by the substrate when the rotation of the micromirror plate touches and is stopped by the mirror stops, as shown in FIG. 4C. This dual-stopping mechanism further guarantees a uniform rotation angle corresponding to the "On" state for all micromirror plates. As a further optional feature, another set of mirror stops for the "OFF" state may also be provided in addition to the set of mirror stops for the "ON" state, as shown in FIG. 4D.

Referring to FIG. 4D, a first set of mirror stops 270 is formed on the hinge structure for providing a uniform "ON" state for all micromirror plates. And a second set of mirror stops 275 is further provided for ensuring a uniform "OFF" state for all micromirror plates. The physical properties (e.g. length and position) of the second set of mirror stops 275 determine the rotation position of the "OFF" state. Alternatively, the second set of mirror stops can be designed and formed such that the other end of the micromirror plate touches and is stopped by the glass substrate when the micromirror plate touches and is stopped by the second set of mirror stops.

In operation, the micromirror plate (e.g. 210 in FIG. 3C) rotates and reflects incident light via projection optics to a target. This type of operation mechanism calls for certain requirements on the optical, mechanical and electric properties of the micromirror plate, hinge structure and contact 255. In particular, the micromirror plate is desired to comprise a material having high reflectivity to the light of interest, for example, a material of early transition metal, metal (e.g. aluminum) or metal alloy. In addition, it is desired that the material of the micromirror plate also exhibits suitable mechanical properties (e.g. large strength and high elastic modulus etc.) for enhancing the mechanical property of the micromirror plate. Furthermore, it is desired that the material of the micromirror plate is electrically conductive such that an electric voltage can be applied thereto.

The hinge-support (e.g. 260 in FIG. 3C) provides an axis by which the micromirror plate (e.g. micromirror plate 210) can rotate. Because the hinge-support may scatter incident light and the scattered light can be mingled with the reflected light, thereby, the contrast ration can be degraded. In order to suppress this type of scattering, the hinge structure is preferably "hidden" beneath the micromirror plate. For example, the hinge structure is formed on a side of the micromirror plate that is opposite to the side of the micromirror plate reflecting the incident light. In accordance with the operation mechanism of the micromirror plate and the constructional design, it is desired that the posts comprise materials that are insusceptible to plastic deformation (e.g. fatigue, creep, dislocation motion) during the operation of the device. It is also preferred that such materials exhibits high stiffness. Opposite to the posts, the hinge (e.g. hinge 240 in FIG. 3D) are expected to be more compliant because the hinge deforms while the micromirror plate rotates. Moreover, the hinge is desired to be electrically conducting such that the micromirror plate can be held at a particular voltage level.

In order to achieve the defined "OFF" states in FIG. 4B and FIG. 4D, external forces (e.g. electrical fields) may required to rotate the micromirror plate. For example, an electrode 283 and circuitry may be disposed underneath the portion of the micromirror plate being rotated away from the substrate. An electric field can then be applied between the electrode and the portion of the micromirror plate for rotating the micromirror plate to the "OFF" state. This design, however, requires extra electrodes and circuitry.

Figure 5A:
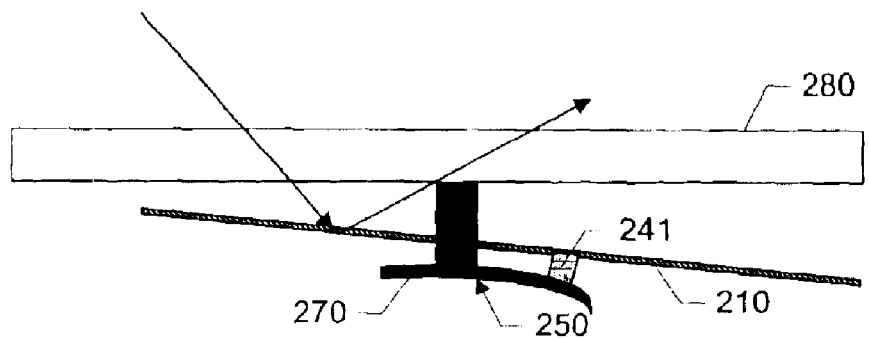
FIG. 5A is a cross-sectional view of a micromirror device having a hinge-support that curves at a natural resting state.

According to an aspect of the invention, a hinge-support with a portion that is curved away from the substrate at the natural resting state is proposed, as shown in FIG. 5A. Referring to FIG. 5A, hinge-support portion 250 is curved away from the substrate at its natural resting state. And micromirror plate 210, which is attached to the curved hinge-support, presents a finite angle with the substrate without external force (e.g. external electrical field). By adjusting the curvature of the hinge-support portion, a desired angle between the micromirror plate and the substrate can be achieved.

Figure 5B:
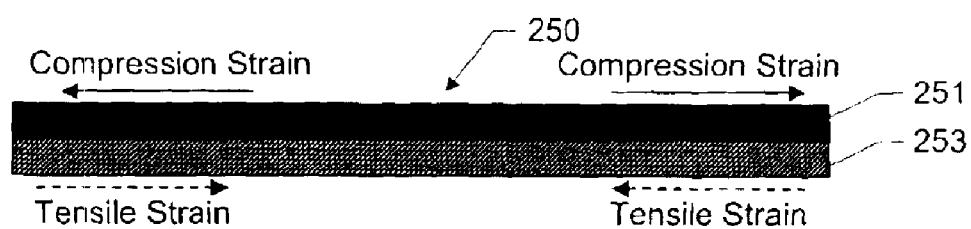
FIG. 5B is a cross-sectional view of an exemplary hinge-support before releasing according to an embodiment of the invention.

The curved hinge-support can be formed in many different ways. An exemplary method will be discussed in the following with references to FIG. 5b and FIG. 5C. Referring to FIG. 5B, hinge-support 250 composes two layers, layer 251 and layer 253. Layer 251 exhibits an outwards compression strain at its deposition state (e.g. when layer 251 is deposited on a sacrificial layer). In the preferred embodiment of the invention, layer 251 is $TiN_x$ with a preferred thickness of 80 Å. Though preferred, layer 251 can be of any suitable material as long as it exhibits an outwards compression strain. The thickness of layer 251 can also be of any suitable range, such as a thickness between 10 Å to 1500 Å. Layer 253 is deposited on layer 251 and exhibits an inwards tensile strain at its deposition state. In a preferred embodiment of the invention, layer 253 is $SiN_x$ with a preferred thickness of 400 Å. Though preferred, layer 253 can be of any suitable material as long as it exhibits an inwards tensile strain. The thickness of layer 253 can also be of any suitable range, such as a thickness between 10 Å to 2000 Å. PVD (physical vapor deposition or sputtering) tends to produce compressive films, especially for high melting temperature metals, whereas CVD (chemical vapor deposition) tends to produce tensile films. Therefore, in one embodiment layer 251 is a layer deposited by PVD and layer 253 is deposited by CVD. In one specific example, layer 251 is a reactively sputtered ceramic layer and layer 253 is a ceramic layer deposited by chemical vapor deposition.

Figure 5C:
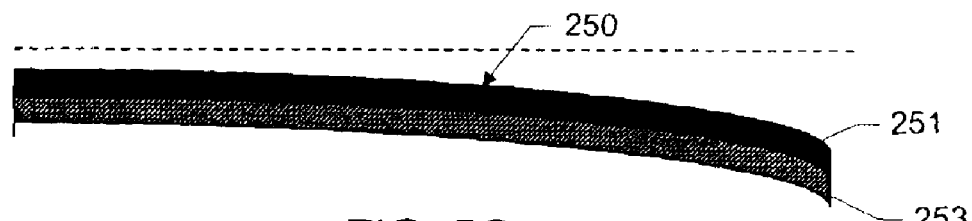
FIG. 5C is a cross-sectional view of the hinge-support of FIG. 5B after releasing.

After releasing, (for example, by removing the sacrificial layer, on which layer 251 is deposited), layers 253 and 251 curve towards layer 253, which exhibits inwards tensile strain. This curving of the two layers is a spontaneous phenomenon and happens in the presence of material stresses. The curvature is determined upon the relative magnitudes of the inwards tensile strain, the outwards compression strain and the elastic moduli. Referring to FIG. 5C, a schematic diagram showing the curved two layers is presented therein. However, depending upon the location of the hinge connection to the mirror plate, the order of the layers can be reversed in order to cause curvature of the hinge structure in the opposite direction while rotating the mirror plate in the same direction for the "OFF" state.

There is a variety of ways to construct the micromirror device described above. Exemplary processes will be discussed in the following with references to FIG. 6A through FIG. 6H. It should be appreciated by those skilled in the art that the exemplary processes are for demonstration purpose only and should not be interpreted as limitations.

Figure 6A:
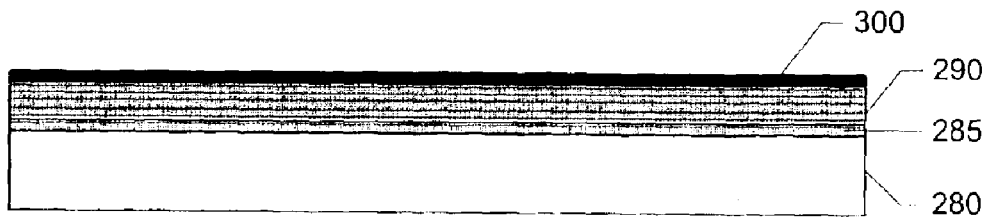
FIG. 6A to FIG. 6H are cross-sectional views of structures illustrating a method for forming a micromirror device according an embodiment of the invention.

Referring to FIG. 6A, substrate 280 is provided. First sacrificial layer 290 is deposited on the substrate followed by the deposition of micromirror plate layer 300. The substrate can be a glass (e.g. 1737F, Eagle 2000), quartz, Pyrex™, sapphire. The substrate may also be a semiconductor substrate (e.g. silicon substrate) with one or more actuation electrodes and/or control circuitry (e.g. CMOS type DRAM) formed thereon.

First sacrificial layer 290 is deposited on substrate 280. First sacrificial layer 290 may be any suitable material, such as amorphous silicon, or could alternatively be a polymer or polyimide, or even polysilicon, silicon nitride, silicon dioxide, etc. depending upon the choice of sacrificial materials, and the etchant selected. If the first sacrificial layer is amorphous silicon, it can be deposited at 300–350° C. The thickness of the first sacrificial layer can be wide ranging depending upon the micromirror size and desired title angle of the micro-micromirror, though a thickness of from 500 Å to 50,000 Å, preferably around 10,000 Å, is preferred. The first sacrificial layer may be deposited on the substrate using any suitable method, such as LPCVD or PECVD.

As an optional feature of the embodiment, anti-reflection layer 285 maybe deposited on the surface of the substrate. The anti-reflection layer is deposited for reducing the reflection of the incident light from the surface of the substrate. Alternatively, other optical enhancing layers may be deposited on either surface of the glass substrate as desired.

Figure 6B:
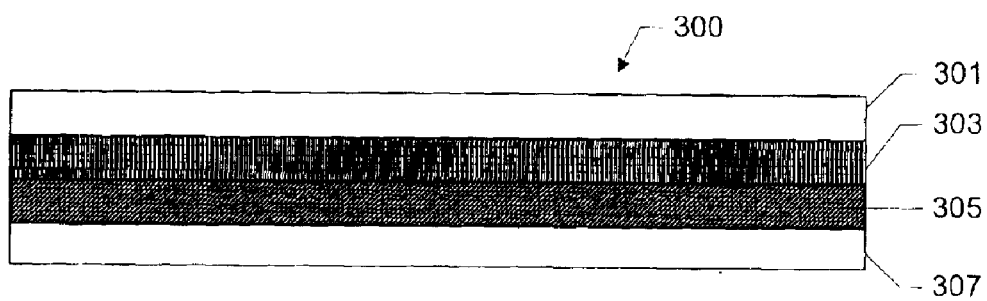

After depositing the first sacrificial layer, a plurality of structure layers will be deposited and patterned as appropriate. According to the invention, a structural layer is a layer that will not be removed after the removal of the sacrificial layers. The first structural layer deposited on the first sacrificial layer is micromirror plate layer 300 for forming a micromirror. Because the micromirror is designated for reflecting incident light in the spectrum of interest (e.g. visible light spectrum), it is preferred that the micromirror plate layer comprises of one or more materials that exhibit high reflectivity (preferably 90% or higher) to the incident light. According to the embodiment of the invention, micromirror plate layer 300 is a multi-layered structure as shown in FIG. 6B. Referring to FIG. 6B, hinge plate layer 300 comprises layers 307, 305, 303 and 301. Layers 307 and 301 are protection layers for protecting the interior layers (e.g. layers 303 and 305). In the preferred embodiment of the invention, layers 307 and 301 are $SiO_x$ with a preferred thickness of 400 Å. Of course, other suitable materials may also be employed herein. Layer 305 is a light reflecting layer that comprises one or more materials exhibiting high light reflectivity. Examples of such materials are Al, $AlTi_x$ (x<0.05), $AlSi_xCu_y$ (x<0.05, and y<0.03) or Ag. In the preferred embodiment of the invention, layer 305 is aluminum with a thickness of 2500 Å. This aluminum layer is preferred to be deposited at 150° C. or other temperatures preferably less than 400° C. Layer 303 is an enhancing layer that comprises of metal or metal alloy for enhancing the electric and mechanical properties of the micromirror plate. An example of such enhancing layer is titanium with a thickness of 80 Å. Of course, other suitable materials having high reflectivity to the incident light of interest may also be adopted for the micromirror plate. In depositing the micromirror plate layer, PVD is preferably used at 150° C. The thickness of the micromirror plate layer can be wide ranging depending upon the desired mechanical (e.g. extrinsic stiffness or strength), the size of the micromirror, desired tilt angle and electronic (e.g. conductivity) properties of the micromirror plate and the properties of the materials selected for forming the micromirror plate. According to the invention, a thickness of from 500 Å to 50,000 Å, preferably around 2500 Å, is preferred.

According to another embodiment of the invention, the light reflecting layer 305 is an electro-conducting layer that comprises a material having a resistivity less than 10,000 $\mu\Omega$·cm. Layers 301 and 307 are insulators with resistivities greater than 10,000 $\mu\Omega$·cm. And layer 303 is an electro-conducting layer with a resistivity also less than 10,000 $\mu\Omega$·cm.

Though the multilayered structure as shown in FIG. 6B preferably comprises four layers, it will be appreciated by those ordinary skills in the art that the number of the multilayered structure should not be interpreted as a limitation. Instead, any number of layers (including a single layer) can be employed without departing from the spirit of the present invention.

Figure 6C:
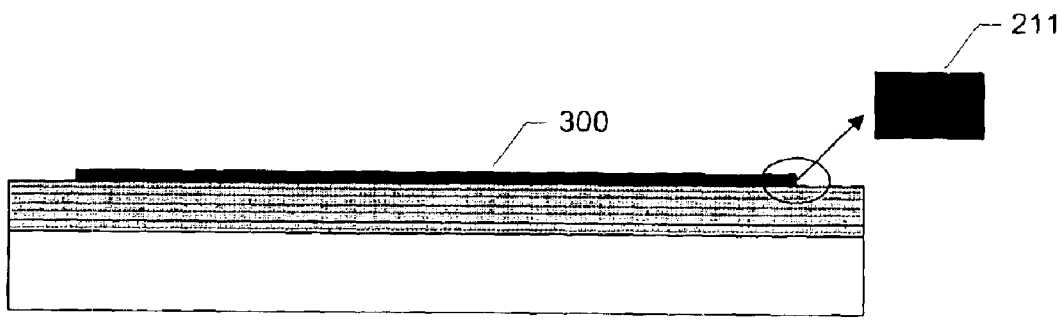

Micromirror plate layer 300 is then patterned into a desired shape, as shown in FIG. 6C. The micromirror can be of any shape as desired. The patterning of the micromirror can be achieved using standard photoresist patterning followed by etching using, for example CF4, C12, or other suitable etchant depending upon the specific material of the micromirror plate layer.

Figure 6D:
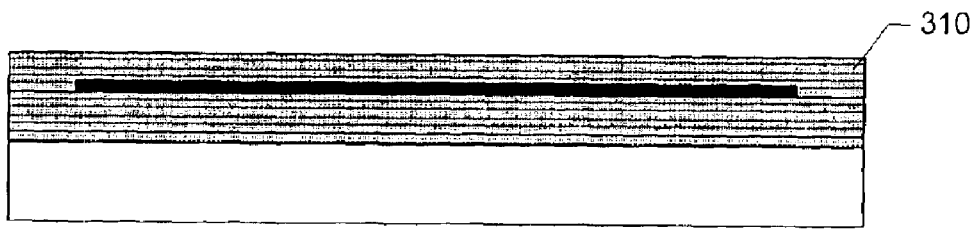

After the formation of the micromirror plate, further structural layers are deposited and patterned. Specifically, a plurality of layers of the hinge structure will be deposited and patterned for forming the binge structure. Referring to FIG. 6D, before depositing further structural layers, second sacrificial layer 310 is deposited on top of the micromirror plate 300 and first sacrificial layer 290. Second sacrificial layer 310 may comprise amorphous silicon, or could alternatively comprise one or more of the various materials mentioned above in reference to first sacrificial layer 290. First and second sacrificial layers need not be the same, though are the same in the preferred embodiment so that, in the future, the etching process for removing these sacrificial layers can be simplified. Similar to the first sacrificial layer, second sacrificial layer 310 may be deposited using any suitable method, such as LPCVD, PECVD or sputtering. If the second sacrificial layer comprises amorphous silicon, the layer can be deposited at 350° C. The thickness of the second sacrificial layer can be on the order of 9000 Å, but may be adjusted to any reasonable thickness, such as between 2000 Å and 20,000 Å depending upon the desired distance (in the direction perpendicular to the micromirror plate and the substrate) between the micromirror plate and the hinge. It is preferred that the hinge and mirror plate be separated by a gap after release of at least 0.5 um (this can be at least 1 um or even 2 um or more if desired). Second sacrificial layer 310 may also fill in the trenches left from the patterning of the micromirror plate.

In the preferred embodiment of the invention, the micromirror plate layer comprises an aluminum layer (e.g. layer 305 in FIG. 6B), and the second sacrificial layer is amorphous silicon. This design, however, can cause defects in the micromirror device due to the diffusion of the aluminum and silicon at the edges of the micromirror plate, wherein the aluminum is exposed to the silicon. To solve this problem, a diffusion barrier layer (not shown) maybe deposited on the patterned micromirror plate before depositing the second sacrificial silicon layer such that the aluminum layer can be isolated from the silicon sacrificial layer. Then the protection layer is patterned according to the shape of the micromirror plate. After the patterning, segments of the protection layer (e.g. segment 211 in FIG. 6C) cover the edges of the micromirror plate for isolating the aluminum and the silicon sacrificial layer.

Figure 6E:
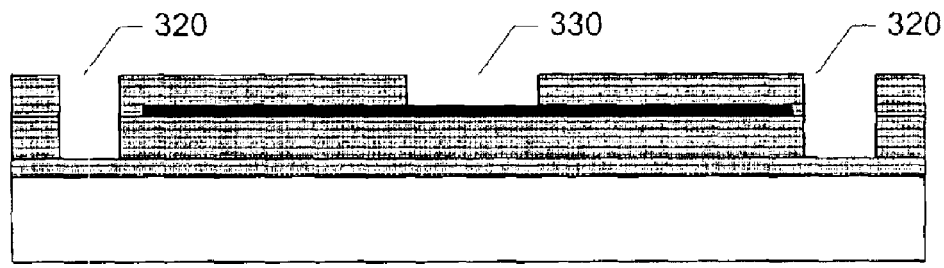

The deposited second sacrificial layer is patterned afterwards for forming two deep-via areas 320 and shallow via area 330 using standard lithography technique followed by etching, as shown in FIG. 6E. The etching step may be performed using $Cl_2$, $BCl_3$, or other suitable etchant depending upon the specific material(s) of the second sacrificial layer. The distance across the two deep-via areas 320 depends upon the length of the defined diagonal of the micromirror plate. In an embodiment of the invention, the distance across the two deep-via areas after the patterning is preferably around 10 μm, but can be any suitable distance as desired. In order to form shallow-via area 330, an etching step using $CF_4$ or other suitable etchant may be executed. The shallow-via area, which can be of any suitable size, is preferably on the order of 2.2 μm on a side.

Hinges and Hinge Materials

Figure 6F:
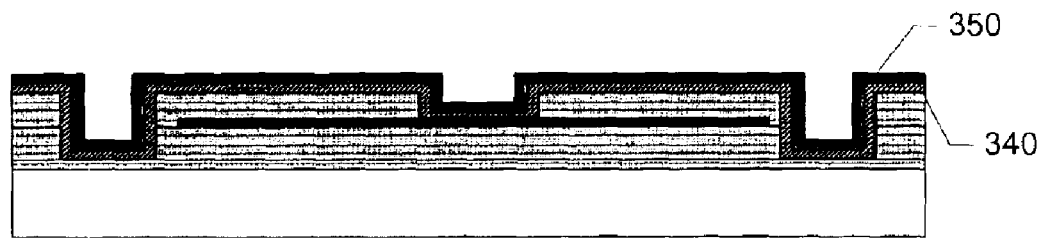

Referring to FIG. 6F, hinge-support layers 340 and 350 are deposited on the patterned second sacrificial layer 310. Because the hinge-support layers (layers 340 and 350) are designated for holding the hinge (e.g. 240 in FIG. 3D) and the micromirror plate (e.g. 210 in FIG. 3C) attached therewith such that the micromirror plate can pivot along the hinge, it is desired that the hinge support layers comprise of materials having a large elastic modulus. According to an embodiment of the invention, layer 340 comprises a 400 Å thickness of $TiN_x$ (although it may comprise both $TiN_x$ with any suitable thickness such as between 100 Å and 2000 Å deposited by PVD, and a 3500 Å thickness of $SiN_x$— although the thickness of the $SiN_x$ layer may be any suitable thickness such as between 2000 Å and 10,000 Å) layer 350 deposited by PECVD. Of course, other suitable materials and methods of deposition may be used (e.g. methods, such as LPCVD or sputtering). The $TiN_x$ layer is not necessary for the invention, but provides a conductive contact surface between the micromirror and the hinge support structure in order to, at least, reduce charge-induced stiction. According to the embodiment of the invention, layers 340 and 350 are deposited such that an inwards compression strain and outwards tensile strain are inherently presented for forming a curved hinge-support (e.g. 250 in FIG. 5A), as shown in FIG. 5C. Alternatively, the $TiN_x$ and SiNx layers can also be deposited such that the intrinsic stress is as low as possible, preferably lower than 250 MPa for forming a flat hinge-support. In either case, the $SiN_x$ layer can be deposited at 400° C.

Figure 6G:
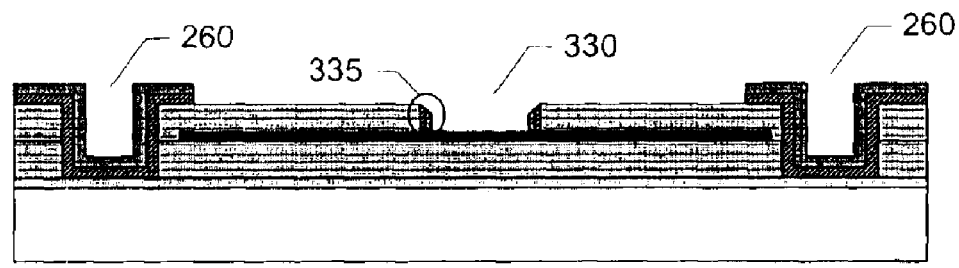

After the deposition, layers 340 and 350 are patterned into a desired configuration (e.g. hinge support 275 in FIG. 3D), as shown in FIG. 6G. Posts 260 can take any desired forms, one of which is shown in FIG. 3D. Alternatively, each of the two posts may be formed as a diamond, such as posts 251 in FIG. 3F. The mirror stops, such as the mirror stops (e.g. mirror stops 270 in FIG. 3D) corresponding to the "ON" state and/or mirror stops (not shown) corresponding to the "OFF" state can also be configured. An etching step using one or more proper etchants is then performed afterwards. In particular, the layers can be etched with a chlorine chemistry or a fluorine chemistry where the etchant is a perfluorocarbon or hydrofluorocarbon (or $SF_6$) that is energized so as to selectively etch the hinge support layers both chemically and physically (e.g. a plasma/RIE etch with $CF_4$, $CHF_3$, $C_3F_8$, $CH_2F_2$, $C_2F_6$, $SF_6$, etc. or more likely combinations of the above or with additional gases, such as $CF_4/H_2$, $SF_6/Cl_2$, or gases using more than one etching species such as $CF_2Cl_2$, all possibly with one or more optional inert diluents). Different etchants may, of course, be employed for etching each hinge support layer (e.g. chlorine chemistry for a metal layer, hydrocarbon or fluorocarbon (or $SF_6$) plasma for silicon or silicon compound layers, etc.). Alternatively, the etching step can be performed after deposition of each hinge support layer. For example, layer 340 can be etched and patterned after the deposition of layer 340 and before the deposition of layer 350.

After etching layers 340 and 350, two posts 260 and a contact area 330 are formed. The bottom segment of contact area 330 is removed by etching and the part of the micromirror plate underneath the contact area is thus exposed. The exposed part of micromirror 210 will be used to form an electric-contact to an external electric source. The sidewalls (e.g. 335) of contact area 330 are left with residues of layers 340 and 350 after etching. The residue 335 has a slope measured by angle, θ, approximately 75 degrees, but may vary between 0 and 89 degrees. The residue on the sidewalls helps to enhance the mechanical and electrical properties of the hinge that will be formed afterwards. Each of the two posts 260 on either side of the mirror can form a continuous element with the posts corresponding to the adjacent micromirror in an array as shown in FIG. 2.

Figure 6H:
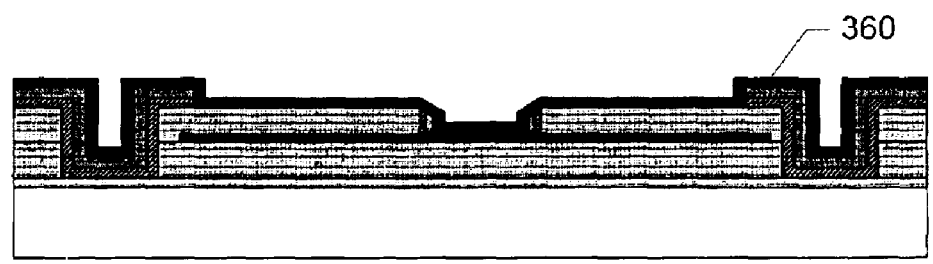

After the completion of patterning and etching of layers 340 and 350, hinge layer 360 is deposited and then patterned as shown in FIG. 6H. Because the hinge provides a rotation axis for the micromirror plate, it is natural to expect that the hinge layer comprises a material that is not susceptible to plastic deformation (e.g. fatigue, creep, and dislocation motion). Furthermore, when the hinge layer is also used as electric contact for the micromirror plate, it is desired that the material of the hinge layer is electrically conductive, or at least one of the layers has some electrical conductivity if a multi-layer hinge is provided.

Figure 8:
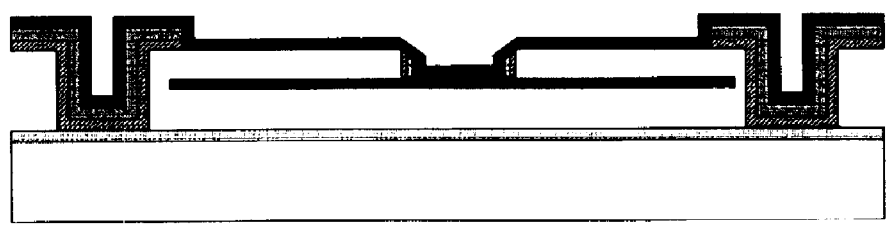
FIG. 8 presents a cross-sectional view of a micromirror device after releasing by removing the sacrificial layers.

After deposition, the hinge layer(s) is then patterned as desired with a suitable etchant. Similar to the hinge layers (layers 340 and 350), the hinge layer can be etched with a chlorine chemistry or a fluorine chemistry where the etchant is a perfluorocarbon or hydrofluorocarbon (or $SF_6$) that is energized so as to selectively etch the hinge layers both chemically and physically (e.g. a plasma/RIE etch with $CF_4$, $CHF_3$, $C_3F_8$, $CH_2F_2$, $C_2F_6$, $SF_6$, etc. or more likely combinations of the above or with additional gases, such as CF$_4$/H$_2$, SF$_6$/Cl$_2$, or gases using more than one etching species such as CF$_2$Cl$_2$, all possibly with one or more optional inert diluents). Different etchants may, of course, be employed for etching different hinge layers In order to release the micromirror plate for pivoting along the hinge, the sacrificial layers (e.g. layers 290 and 310) are removed by etching as discussed below. A cross-sectional view of the released micromirror device is presented in FIG. 8.

In the above described exemplary fabrication process, the processes for forming the hinge support (e.g. processes described in FIG. 6A to FIG. 6G) and the process for forming the hinge (e.g. process described in FIG. 6H) are performed consecutively. In particular, the patterning and etching of the hinge support is followed by the deposition, patterning and etching of the hinge. The hinge and the hinge support can be formed simultaneously according to another embodiment of the invention, which will be described in the following with references to FIG. 7A and FIG. 7B.

Figure 7A:
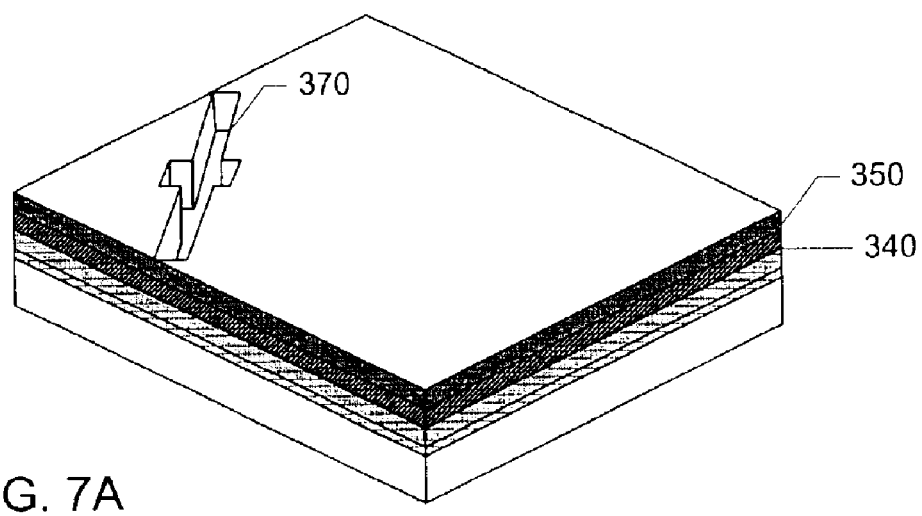
FIG. 7A to FIG. 7B are cross-sectional views of structures illustrating another method for forming a micromirror device according to another embodiment of the invention.
Figure 7B:
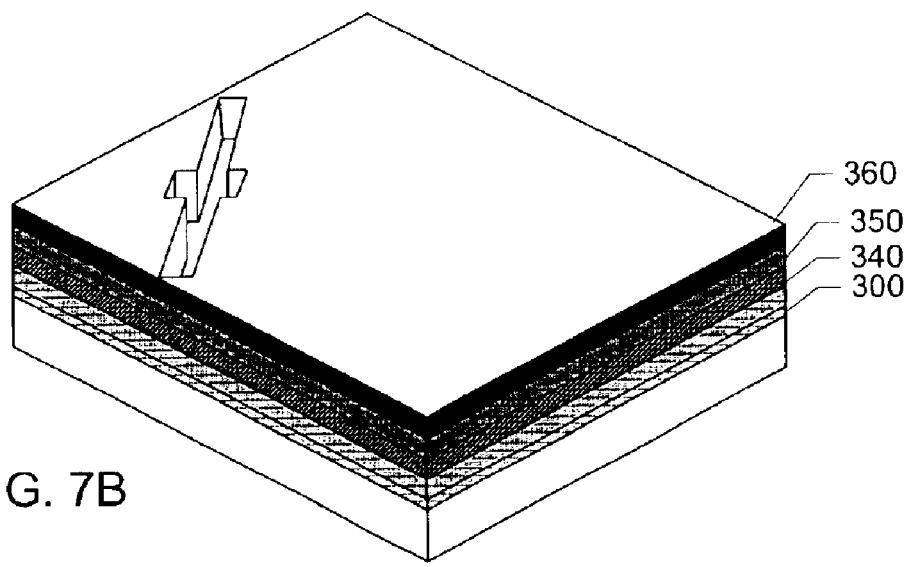

Referring to FIG. 7A, the deposited hinge layers 340 and 350 for the hinge support (e.g. 275 in FIG. 3D) are first patterned and etched according to the desired configuration of the hinge. After etching, window 370 corresponding to the future location of the hinge (e.g. hinge 240 in FIG. 3D) is thus formed thereby. Window 370 is disposed parallel to but offset from a diagonal of the micromirror plate. The window is etched down to the top surface of the second sacrificial layer (e.g. 310 in FIG. 6D) and/or micromirror plate such that the bottom of the window exposes a part of the micromirror plate.

Following the completion of the patterning, hinge layer 360 is deposited on the patterned hinge support layer (e.g. 350) and fills window 370. After deposition, layer 340, 350 and 360 are then patterned and etched simultaneously. In a preferred embodiment of the invention, layers 340 and 350 are patterned and etched simultaneously using the same method that is described in FIG. 6G. After patterning and etching of layers 340 and 350, the sacrificial layers are removed by etching for releasing the micromirror device.

As mentioned above, the flexible part of the MEMS device can be formed of a transition metal nitride which is resistant to attack by the spontaneous gas phase chemical etchant used in the final release. The transition metal nitride layer is preferably formed by sputtering a transition metal target (e.g. a single transition metal, more than one transition metal such as an alloy of two or more transition metals, or a transition metal compound (e.g. transition metal aluminide or preferably silicide) in nitrogen gas. Though the target could be a combination of more than one transition metal (or two transition metals in alloy form), in one embodiment it is preferred that the target comprise a single transition metal, or one (or more) transition metals and one or more metalloids (and, perhaps, minute quantities of impurities such as O, H, other transition metals, metalloids, etc., which are often present in various sputtering methods). In one embodiment, the target comprises at least one transition metal and at least one metalloid. In another embodiment, the target comprises a single transition metal without any other metals except perhaps as impurities or in trace amounts. In such a case, it is preferred that the transition metal of the target make up 90% or more of the target, preferably 98% or more. And, though nitrogen and argon are the preferred gases for reactive sputtering in the present invention (e.g. 20% N2, 80% Ar), small amounts of oxygen or hydrogen (or compounds thereof such as a transition metal oxide in small amounts) can be present in the layer or structure being formed (the oxygen and/or hydrogen in the layer coming from target "impurities" or from the sputtering gas.

The sputtering or PVD (physical vapor deposition) can be performed in any of a number of known PVD systems, including dc glow-discharge sputtering systems, rf glow discharge sputtering systems, and magnetron sputtering systems. Commercially available examples include the Varia (3000 series) sputtering system, the Applied Materials Endura VHP PVD system, the Applied Materials Centura HP PVD system, and the MRC Eclipse Sputtering system. Other systems and methods are disclosed in the Handbook of Physical Vapor Deposition, D. M. Mattox, 1998, incorporated herein by reference. The sputtering target can be any suitable target, such as one supplied by Cerac, Honeywell or Praxair.

The transition metals are those elements in the periodic table in columns 3 to 12 (1B to 8B), namely columns beginning with Sc, Ti, V, Cr, Mn, Fe, Co, Ni, Cu and Zn. Preferred are those elements in columns 3B, 4B, 5B, 6B and 7B—however late transition metals in columns 8B, 1B and 2B are also possible in the present invention, though preferably in conjunction with an early transition metal. In one embodiment of the invention, a single transition metal is sputtered from a target in a nitrogen atmosphere to form a (single) transition metal nitride. It is also within the invention to provide a target with more than one transition metals (or a plurality of targets with different transition metals). In one embodiment of the invention, the target comprises at least one late transition metal—and single or multiple early transition metals that each form nitrides when sputtered. The late transition metal target can also comprise one or more early transition metals and/or one or more metalloids (B, Si, Ge, As, Sb)—each forming nitrides during sputtering. It is also possible to use only metalloids (a single metalloid or more than one metalloid in the target), though having at least one transition metal is preferred in the present invention. Processing parameters can be optimized to increase amorphousness of the deposited film.

If a plurality of metals or metalloids is present in the MEMS structure, each need not be formed as a compound with nitrogen. It is within the invention that one transition metal or metalloid is in nitride form, and an additional metal or metalloid is present in element form. For example, a single transition metal nitride can be present in the MEMS structure along with an additional metal or metalloid in elemental form. Likewise, a metalloid nitride can be present in the MEMS structure along with an additional metal or metalloid in compound or elemental form. In a specific embodiment, the MEMS structure comprises a transition metal nitride and a metalloid nitride (e.g. silicon nitride) and the etchant is a noble gas fluoride. In another embodiment, the MEMS structure comprises a transition metal nitride or a transition metal oxynitride with optional minor amounts of boron, carbon or phosphorous. Preferred early transition metal nitrides (including early transition metal silicon nitrides, oxynitrides, silicon oxynitrides, carbonitrides etc.) are those from columns 3b (Sc, Y, Lu, Lr), 4b (Ti, Zr, Hf, Rf), 5b (V, Nb, Ta, Db), 6b (Cr, Mo, W, Sg) and 7b (Mn, Tc, Re, Bh) of the periodic table. However, preferred are early transition metals in columns 4b to 6b, in particular tungsten, titanium, zirconium, hafnium, niobium, tantalum, vanadium and chromium.

Si and B are preferred metalloids, though any of the metalloids can be used in the present invention. Ti, V, Zr, Ta and W are preferred early transition metals, though any of the early transition metals can be used in the present invention in accordance with the above. Some specific examples within the present invention include tantalum nitride, tantalum silicon nitride, tantalum oxynitride, tantalum silicon oxynitride, vanadium nitride, vanadium oxynitride, titanium nitride, titanium silicon nitride, titanium silicon oxynitride, titanium boronitride, zirconium nitride, tungsten silicon nitride, tungsten nitride, tungsten silicon oxynitride, tungsten oxynitride, tungsten silicon carbonitride, molybdenum silicon nitride, molybdenum silicon oxynitride, tungsten boronitride, indium nitride, hafnium nitride, zirconium silicon nitride, vanadium silicon nitride, vanadium boronitride, tantalum boronitride, scandium boronitride, scandium nitride, scandium silicon nitride and molybdenum boronitride. Preferred are binary (nitrides) or ternary nitrides of titanium, tantalum and tungsten (e.g. silicon nitrides, silicon oxynitrides, oxynitrides). These are but a few examples that can be used for the MEMS structure (particularly the flexible portion of the MEMS device) as set forth herein.

Silicon can be added to the target so that the film formed resembles a late transition metal+SiNx (in one embodiment of the invention, two early transition metals and silicon are part of a target, whereas in another embodiment of the invention, one or more late transition metals and silicon are present in the target). Some of these types of films are disclosed in U.S. provision application Ser. No. 60/228,007 to Reid et al. filed Aug. 23, 2000, incorporated herein by reference. Also, near metalloids such as phosphorous and/or carbon can be added to the transition metal target so as to form transition metal—phosphonitrides and/or transition metal—carbonitrides. Oxygen is preferably not present in the sputtering atmosphere if electrically conductive films are desired—however, some transition metals form electrically conductive compounds with oxygen, e.g. Ru and In (which form RuO2 and In2O3).

Many variations from the above-described examples are possible. For example, in place of sputtering the films as described above, it is also possible to deposit the films by chemical vapor deposition (e.g. PECVD or LPCVD). Also, though electrically conductive films are preferred in the present invention, electrically insulating films are also with the scope of the invention. And, electrically insulating films (e.g. many metal nitrides) can be formed with elemental metals or metalloids to improve conductivity if conductivity is desired.

In a preferred embodiment of the invention, the hinge materials above are used in a process for releasing the MEMS devices in a spontaneous vapor phase chemical etchant, such as a noble metal halide or an interhalogen. The release etching utilizes an etchant gas capable of spontaneous chemical etching of the sacrificial material, preferably isotropic etching that chemically (and not physically) removes the sacrificial material. Such chemical etching and apparatus for performing such chemical etching are disclosed in U.S. patent application Ser. No. 09/427,841 to Patel et al. filed Oct. 26, 1999, and in U.S. patent application Ser. No. 09/649,569 to Patel at al. filed Aug. 28, 2000, the subject matter of each being incorporated herein by reference. Preferred etchants for the release etch are gas phase fluoride etchants that, except for the optional application of temperature, are not energized. Examples include HF gas, noble gas halides such as xenon difluoride, xenon tetrafluoride and interhalogens such as $IF_5$, $BrCl_3$, $BrF_3$, $IF_7$ and $ClF_3$. The release etch may comprise additional gas components such as $N_2$ or an inert gas (Ar, Xe, He, etc.). In this way, the remaining sacrificial material is removed and the micromechanical structure is released. In one aspect of such an embodiment, $XeF_2$ is provided in an etching chamber with diluents (e.g. $N_2$ and He). The concentration of $XeF_2$ is preferably 8 Torr, although the concentration can be varied from 1 Torr to 30 Torr or higher. This non-plasma etch is employed for preferably 900 seconds, although the time can vary from 60 to 5000 seconds, depending on temperature, etchant concentration, pressure, quantity of sacrificial material to be removed, or other factors. The etch rate may be held constant at 18 Å/s/Torr, although the etch rate may vary from 1 Å/s/Torr to 100 Å/s/Torr. Each step of the release process can be performed at room temperature.

In addition to the above etchants and etching methods mentioned for use in either the final release or in an intermediate etching step, there are others that may also be used by themselves or in combination. Some of these include wet etches, such as ACT, KOH, TMAH, HF (liquid); oxygen plasma, $SCCO_2$, or super critical $CO_2$ (the use of super critical $CO_2$ as an etchant is described in U.S. patent application Ser. No. 10/167,272, which is incorporated herein by reference). Of course, the etchants and methods selected should be matched to the sacrificial materials being removed and the desired materials being left behind. However, preferred are the spontaneous vapor phase chemical etchants that etch isotropically in the absence of a plasma—such as those noted above.

It will be appreciated by those of skill in the art that a new and useful spatial light modulator has been described herein. In view of the many possible embodiments to which the principles of this invention may be applied, however, it should be recognized that the embodiments described herein with respect to the drawing figures are meant to be illustrative only and should not be taken as limiting the scope of invention. For example, those of skill in the art will recognize that the illustrated embodiments can be modified in arrangement and detail without departing from the spirit of the invention. In particular, each of the layers of the structure layers, such as micromirror plate layer 300 (which may further comprises layers 301, 303, 305 and 307 as shown in FIG. 6B), hinge support layers 340 and 350, and hinge layer 360 may comprise one or more of a number of suitable materials that are either electro-conducting or electro-insulating, as long as at least one of the layers is electro-conducting and provides electro-contact to the micromirror. Also, though PVD and CVD are referred to above, other thin film deposition methods could be used for depositing the layers, including spin-on, sputtering, anodization, oxidation, electroplating and evaporation. Therefore, the invention as described herein contemplates all such embodiments as may come within the scope of the following claims and equivalents thereof.

We claim:

1. A method for making a microelectromechanical device, the method comprising:
    depositing a sacrificial material on a substrate;
    forming an array of MEMS elements comprised of plates and hinges, wherein the hinges of the MEMS elements comprise an early transition metal (groups 3b–7b of the periodic table) nitride; and
    releasing the MEMS elements by removing the sacrificial material in a spontaneous gas phase chemical etchant selected from interhalogens and noble gas halides, wherein the early transition metal nitride is exposed to the etchant during removal of the sacrificial material but remains after the MEMS elements are released.

2. The method of claim 1, wherein the hinges are titanium nitride or titanium silicon nitride and the etchant is xenon difluoride.

3. The method of claim 1, wherein the hinges are a laminate comprising a layer of silicon nitride and a layer of an early transition metal nitride.

4. The method of claim 1, wherein the hinges comprise both an early transition metal nitride and a late transition metal.

5. The method of claim 1, wherein the hinges comprise a material selected from NbN, VN, HfN, ZrN and YN.

6. The method of claim 1, wherein the hinges have a length to width ratio of 2:1 to 40:1.

7. The method of claim 1, wherein the hinges have a length to thickness ratio of from 50:1 to 200:1.

8. The method of claim 1, wherein the length of each hinge is less than 20 micrometers.

9. The method of claim 1, wherein the width of each hinge is greater than 0.1 micrometers and less than 2 micrometers.

10. The method of claim 1, further comprising packaging the MEMS element array and placing the packaged array in a projection display apparatus.

11. The method of claim 1, wherein the hinges are electrically conductive.

12. The method of claim 1, wherein the hinges are multi-layer hinges.

13. The method of claim 12, wherein the hinges comprise a layer of titanium silicon nitride and a layer of titanium nitride.

14. The method of claim 12, wherein a layer of the multi-layer hinges comprises titanium.

15. The method of claim 12, wherein a layer of the multilayer hinges comprise tungsten.

16. The method of claim 1, wherein the etchant is an interhalogen.

17. The method of claim 16, wherein the etchant is BrF3 or BrCl3.

18. The method of claim 1, wherein the etchant is a noble gas halide.

19. The method of claim 18, wherein the etchant is xenon difluoride.

20. The method of claim 18, wherein the sacrificial material comprises amorphous silicon.

21. The method of claim 18, wherein the sacrificial material comprises an early transition metal.

22. The method of claim 1, wherein the vertical depth of each hinge is from 30 to 1000 Angstroms.

23. The method of claim 22, wherein the vertical depth of each hinge is from 300 to 600 Angstroms.

24. The method of claim 1, wherein the hinges are formed by reactively sputtering a target in a nitrogen gas.

25. The method of claim 24, wherein the hinges are formed by reactively sputtering an early transition metal target in a nitrogen or nitrogen/oxygen gas.

26. The method of claim 24, wherein the hinges are formed by reactively sputtering an early transition metal silicide target in a nitrogen or nitrogen/oxygen gas.

27. The method of claim 1, wherein the step of forming the array of MEMS elements comprises:
depositing the sacrificial material in a first layer;
depositing further sacrificial material in a second layer;
wherein plates are deposited and patterned on one of the sacrificial layers and hinges are deposited and patterned on the other of the sacrificial layers.

28. The method of claim 27, wherein the first and second sacrificial layers comprise the same material.

29. The method of claim 27, wherein the forming of the array of MEMS elements comprises:
forming the plates on the deposited sacrificial material in the first layer and;
forming the hinges on said further sacrificial material in the second layer.

30. The method of claim 29, wherein the substrate is a substrate transmissive to visible light.

31. The method of claim 27, wherein the forming the array of MEMS elements comprises:
forming the hinges on the deposited sacrificial material in first layer and;
forming the plates on said further sacrificial material in the second layer.

32. The method of claim 31, wherein the substrate is a semiconductor substrate.

33. The method of claim 1, wherein the MEMS elements are operable in binary mode and are rotatable from a non-deflected state to an ON state, the ON state being at least 10 degrees from the non-deflected state.

34. The method of claim 33, wherein the ON state is at least 12 degrees from the non-deflected state.

35. The method of claim 34, wherein the ON state is at least 14 degrees from the non-deflected state.

36. The method of claim 1, herein the early transition metal of the early transition metal nitride is selected from titanium, tantalum, chromium, molybdenum and tungsten.

37. The method of claim 36, wherein the plates comprise a reflective aluminum layer.

38. The method of claim 36, wherein the plates comprise a reflective silver layer.

39. The method of claim 36, wherein the early transition metal is tungsten.

40. The method of claim 39, wherein the hinges comprise tungsten silicon nitride.

41. The method of claim 39, wherein the hinges comprise tungsten titanium nitride.

42. The method of claim 39, wherein the hinges comprise tungsten oxynitride or tungsten carbonitride.

43. The method of claim 36, wherein the early transition metal is molybdenum.

44. The method of claim 43, wherein the hinges comprise molybdenum silicon nitride.

45. The method of claim 36, wherein the early transition metal is tantalum.

46. The method of claim 45, wherein the hinges comprise tantalum oxynitride.

47. The method of claim 45, wherein the hinges comprise tantalum nitride.

48. The method of claim 45, wherein the hinges comprises tantalum silicon nitride or tantalum silicon oxynitride.

49. The method of claim 45, wherein the hinges comprise tantalum titanium nitride.

50. The method of claim 45, wherein the hinges comprises tantalum titanium silicon oxynitride.

51. The method of claim 36, wherein the hinges further comprise silicon nitride.

52. The method of claim 51, wherein the hinges further comprise a late transition metal.

53. The method of claim 36, wherein the early transition metal is titanium.

54. The method of claim 53, wherein the hinges comprise titanium silicon nitride.

55. The method of claim 53, wherein the hinges comprise titanium nitride.

56. The method of claim 53, wherein the hinges comprise titanium oxynitride.

57. The method of claim 56, wherein the hinges comprise titanium silicon oxynitride.

58. The method of claim 36, wherein the early transition metal is chromium.

59. The method of claim 58, wherein the hinges comprise chromium nitride.

60. The method of claim 59, wherein the hinges comprise chromium oxynitride.

61. A method for making a micromirror array for a projection display, comprising:

depositing a sacrificial material on a substrate;

forming an array of micromirrors comprised of mirror plates and hinges, wherein the hinges of the micromirrors comprise an early transition metal (groups 3–7 of the periodic table) nitride; and releasing the micromirrors by removing the sacrificial material in a spontaneous gas phase chemical etchant selected from interhalogens and noble gas halides, wherein the early transition metal nitride is exposed to the etchant during removal of the sacrificial material but remains after the micromirrors are released.

62. A method of making a micromirror array device, the method comprising:

deposition a sacrificial material on a substrate;

forming an array of micromirrors comprised of mirror plates and hinges, wherein the hinges comprise $TiN_x$; and releasing the micromirrors by removing the sacrificial material in a spontaneous gas phase etchant comprising gas phase xenon difluoride, wherein the $TiN_x$ is exposed to the etchant during removal of the sacrificial material but remains after the micromirrors being released.

63. The method of claim 62, wherein the hinge further comprises silicon nitride.

64. The method of claim 62, wherein the substrate is a light transmissive substrate.

65. The method of claim 62, wherein the step of forming an array of micromirrors further comprises:

depositing the sacrificial material in a first layer;

depositing the sacrificial material in a second layer;

wherein the plates are deposited and patterned on one of the first and second layers; and wherein the hinges are deposited and patterned on the other one of the first and second layers.

66. The method of claim 65, wherein the sacrificial material on the first and second layer comprise the same material.

67. The method of claim 65, wherein the hinges are deposited and patterned before the plates.

68. The method of claim 65, wherein the plates are deposited and patterned before the hinges.

\* \* \* \* \*